United States Patent [19]

Kiess et al.

[11] 4,296,478

[45] Oct. 20, 1981

[54] READOUT OF ELECTROSTATICALLY STORED INFORMATION

[75] Inventors: Helmut G. Kiess, Niedersteinmaur; Bruno K. Binggeli, Arni, both of Switzerland

[73] Assignee: RCA Corporation, New York, N.Y.

[21] Appl. No.: 84,394

[22] Filed: Oct. 12, 1979

[51] Int. Cl.³ .............................................. G11C 11/23
[52] U.S. Cl. .................................... 365/112; 365/215
[58] Field of Search ............... 365/106, 112, 118, 217, 365/234, 215

[56] References Cited

U.S. PATENT DOCUMENTS

| 2,965,783 | 12/1960 | Jaffe | 365/118 |
| 2,972,082 | 2/1961 | Kallmann et al. | 365/118 |

OTHER PUBLICATIONS

Blanchard, "Beam Addressable NDRO Memory", IBM Tech. Disc. Bul., vol. 11, No. 4, 9/68.

Primary Examiner—Stuart N. Hecker
Attorney, Agent, or Firm—Samuel Cohen; George J. Seligsohn

[57] ABSTRACT

The method of, and apparatus for, producing an electrical video signal representing a charge pattern on an insulating dielectric sheet or film, without destroying the charge pattern, including the steps of: placing a transparent electrode on the free top surface of the dielectric film, placing the dielectric film having the charge pattern in close contact with the free top surface of an uncharged photoconductor having a back electrode connected to a load impedance, and scanning the photoconductor through said transparent electrode and said dielectric film with a flying spot of light to produce a video electrical signal across the load impedance during the scanning.

6 Claims, 6 Drawing Figures

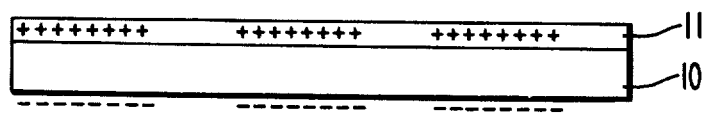
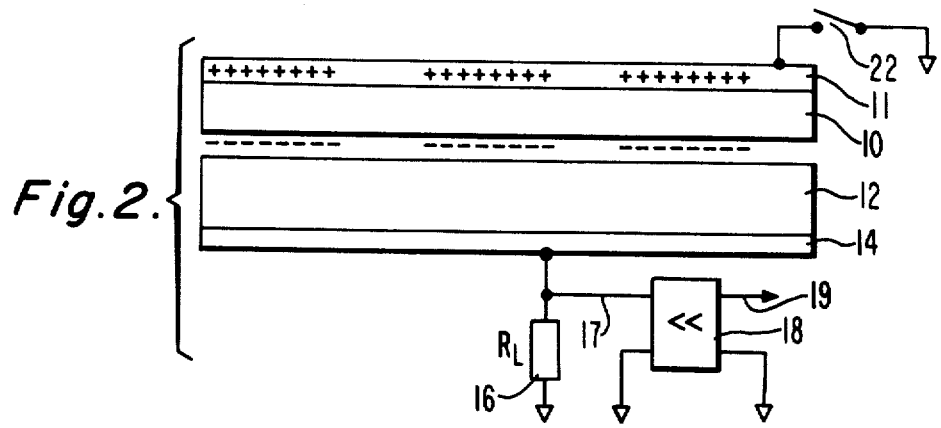
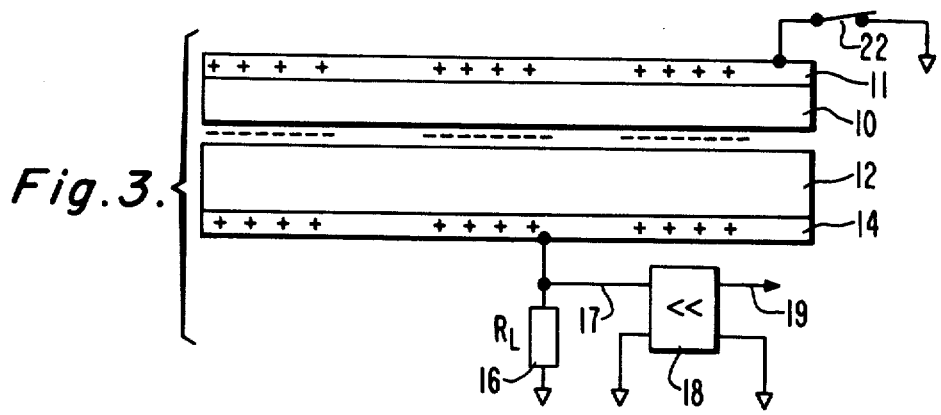

READOUT OF ELECTROSTATICALLY STORED INFORMATION

This invention relates to electrophotography, and more particularly to a method of, and apparatus for, producing video electrical signal from a charge pattern representing an image on an insulating dielectric sheet or film.

Graphic information can be stored in form of electrostatic charge patterns on highly-insulating dielectric films such as "Mylar" (polyethylenteraphthalate), "Makrofol" (polycarbonate), etc., for long periods of time. The information can be read nondestructively by capacitively scanning the film with a metal oxide semiconductor (MOS) device. However, high mechanical precision of the moving parts is required since a change in distance from the sensor to the surface of the film by only a few micrometers gives a change of the induced charge on the MOS causing unwanted signals and distortions of the information. Therefore a different method is needed which avoids the expensive high precision mechanics of a mechanical scanning apparatus.

Graphic information can be put onto highly-insulating dielectric sheets or films using a fine probe to which an electrical signal is applied. Charge is then transferred to the surface of the film in correspondence to the applied voltage and the capacitance of the film. The deposited charge patterns stay on the surface of the insulator for at least several months. Similarly, latent images obtained in the electrophotographic process can be transferred to insulating films in a manner described in U.S. patent application Ser. No. 778,593 filed on Mar. 17, 1977, for a "Method of Performing High-Sensitivity Electrophotography" by the same inventor and assignee as the present application. In the electrophotographic process, the insulating dielectric film preferably has a thickness of 10 micrometers and the latent image on the film is stored in form of a monopolar or dipolar charge pattern. A lower limit of the charge densities of latent images is between $10^{-9}$ to $10^{-10}$ Asec/cm$^2$. If the size of the picture element is assumed to be 10 $\mu$m × 10 $\mu$m, the charge to be measured amounts to $\sim 10^{-15}$ Asec. It is desirable to be able to read out charge patterns of this and higher values. The readout is more easily accomplished when the charge densities are higher and/or a lower resolution is acceptable. It is also desirable to accomplish the readout of the graphic charge pattern without destroying it.

In accordance with an example of the invention, an electrical signal representing a charge pattern on an insulating dielectric film is produced by the steps of: placing the insulating film having the charge pattern in close contact with the top surface of an uncharged photoconductor having a back electrode, connecting a signal output impedance between the back electrode and a transparent electrode on the top surface of the dielectric film, and scanning the photoconductor through said transparent electrode and said dielectric film with a flying spot of light to produce an electrical video signal across the impedance during the scanning.

In the drawing:

FIG. 1 is an edge view of an insulating dielectric film having a dipolar charge pattern thereon;

FIG. 2 is an edge view of the insulating dielectric film of FIG. 1 after it is placed on a photoconductor having a back electrode;

FIG. 3 is a view like FIG. 2 after the transparent electrode on the top surface of the insulating dielectric film is connected to ground to complete a path through a load resistor to the back electrode;

Figure 4:
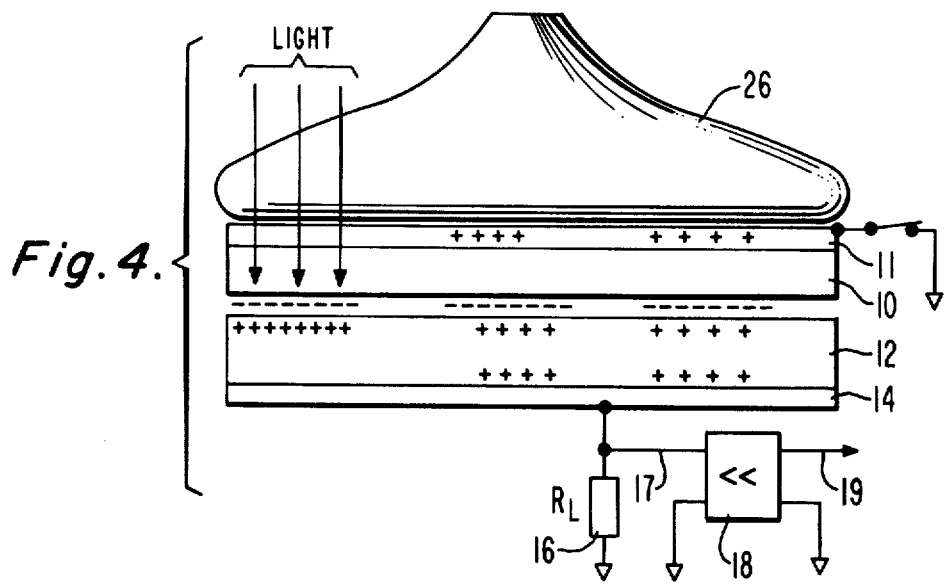
FIG. 4 is a view illustrating the scanning of the photoconductor for the generation of an electrical signal representing the stored charge pattern.

Reference is now made in greater detail to the drawing for a description of a method by which a latent charge pattern image on an insulating dielectric film can be read out in the form of an electrical video signal suitable for use in displaying the image on a cathode-ray-tube display unit. FIG. 1 shows the edge of a sheet or film 10 of an insulating dielectric material such as "Mylar" (trademark of E. I DuPont Company, Wilmington, Del.,) or "Makrofol" (trademark of Bayer AG, Leverkusen, West Germany.) The film 10 may have a thickness of 10 micrometers. The sheet 10 has a latent charge pattern thereon represented by positive charges (+) on the top of the sheet and matching negative charges (−) on the bottom of the sheet. The charge pattern is delimited by the surrounding areas which are free of charge pairs. The film 10 is shown as having on its top surface a transparent electrode 11, which may be a thin evaporated metal, or may be a conductive liquid such as a mixture of ethyl ether and ethanol.

FIG. 2 shows the insulating dielectric film 10 with its charge pattern, positioned with its bottom surface in close contact with the free upper surface of a noncharged photoconductive plate 12 having a back electrode 14 on the bottom surface thereof. The photoconductive plate 12 may have a thickness of from five to fifty micrometers and may be of a material such as cadmium selenide having the formula CdSe. The back conductor 14 is connected through a load resistor 16 to ground or point of reference potential, and is connected over a path 17 to an amplifier 18.

FIG. 3 illustrates the next step of making an electrical connection through a switch 22 from transparent electrode 11 to ground or point of reference potential. If the transparent conductive electrode 11 is a liquid, it may be applied to the top surface of dielectric film 10 just before the transparent electrode is connected to ground, instead of initially as shown in FIGS. 1 and 2. When the transparent electrode 11 is connected to ground, a migration of positive charges occurs from near the transparent electrode 11 to near the back conductor 14 of the photoconductor 12 as shown in FIG. 3.

Next, a light beam is directed, in line-by-line scanning fashion, through the transparent electrode 11, and the insulating dielectric film 10 to the photoconductor 12. The scanning light beam may be provided by a flying spot scanner 26 including a cathode ray tube, or by a laser light source in combination with an optical scanning apparatus. The light beam renders the photoconductor 12 conductive so that positive charges in the path of the light beam migrate from the upper surface of the insulating dielectric film 10, and the vicinity of the back conductor 14 of the photoconductor 12, to the interface of the upper surface of the photoconductor 12 and the lower surface of the insulating dielectric film 10. The flow of charge to the interface involves a current flow through the load resistor 16, manifested as a voltage across the load resistor, which is amplified by amplifier 18 to become a video signal at 19 which can be displayed on the face of a cathode-ray-tube display device (not shown). The image thus produced is a reproduction of the image represented by a pattern of stored charges on the insulating dielectric film 10 in FIG. 1. The definition with which the image is reproduced is determined by the spot size of the light beam used to scan the photoconductor 12 in FIG. 4.

Figure 5:
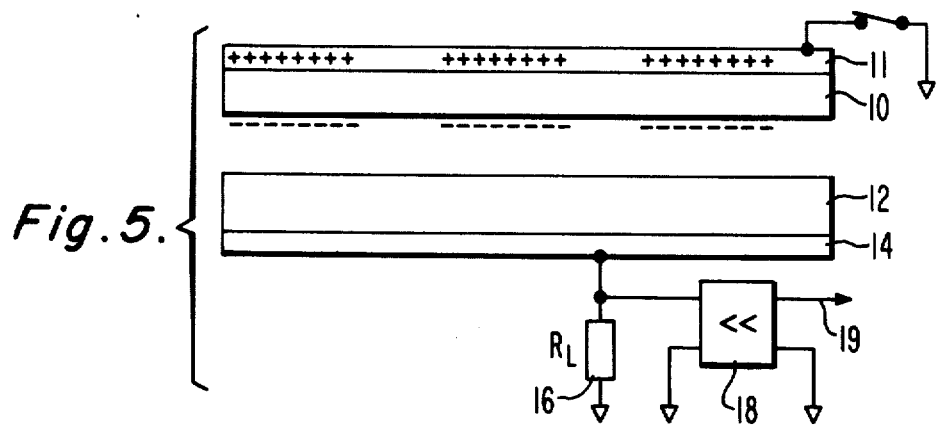
FIG. 5 is a view illustrating the separation of the insulating dielectric film from the photoconductor.
Figure 6:
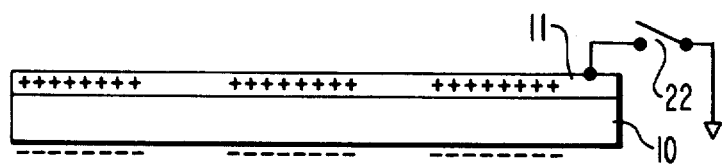
FIG. 6 is a view of the insulating dielectric film with its charge pattern restored to the condition it had in FIG. 1.

After the electrical read-out of the charge pattern, the insulating dielectric film 10 is removed from contact with the photodetector 12, as shown in FIG. 5. When this is done, the charge pattern remaining on the film 10 is the same as the charge pattern originally stored on the film 10 in FIG. 1. The transparent electrode 11 is then disconnected from ground and the dielectric film 10 with its charge pattern, as shown in FIG. 6, can then be stored for long periods of time without loss of the charge pattern. The read-out of the charge pattern on dielectric film 10, as shown in FIG. 4, is accomplished without a destruction of the charge pattern thereon.

What is claimed is:

1. A method of producing an electrical signal representing a charge pattern on an insulating dielectric film, without destroying the charge pattern, comprising placing a transparent electrode on the free top surface of said dielectric film, placing the insulating dielectric film having the charge pattern in close contact with the free surface of an uncharged photoconductor having a back electrode connected through a signal output impedance to a point of reference potential, scanning said photoconductor through said transparent electrode and said dielectric film with a flying spot of light to produce a video electrical signal across said impedance during said scanning, and removing the dielectric film from the photoconductor, whereby the original charge pattern on the dielectric film is retained.

2. The method of claim 1, and the additional step of connecting said transparent electrode to said point of reference potential before said scanning.

3. The method of claim 1, and the additional step of disconnecting said transparent electrode from said point of reference potential.

4. Apparatus for non-destructively translating a charge pattern on a dielectric film, which is of one polarity on one surface on the film, to serially occurring electrical signals, comprising, in combination:

a transparent conductive first electrode on one of the surfaces of the film;

a photoconductive plate one surface of which is adjacent to the opposite surface of the film;

a conductive second electrode over the other surface of the plate;

a load impedance connected between said second electrode and a point of reference potential;

means for scanning a light spot over said photoconductive plate through said first electrode and said dielectric film while said first electrode is connected to said point of reference potential, whereby current flows through said load impedance in amounts dependent upon the charge present in the successive regions of said dielectric film being scanned by said light spot;

signal output terminals connected across said load impedance; and means for disconnecting said first electrode from said point of reference potential after the film is moved away from the plate.

5. The apparatus of claim 4 wherein said transparent conductive first electrode is a liquid.

6. The apparatus of claim 4 wherein said transparent conductive first electrode is a thin metallic film.

* * * * *